United States Patent
Herrault

(10) Patent No.: US 12,463,109 B2
(45) Date of Patent: Nov. 4, 2025

(54) THERMAL ISOLATION BETWEEN EMBEDDED MECA MODULES

(71) Applicant: HRL Laboratories, LLC, Malibu, CA (US)

(72) Inventor: Florian Herrault, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 508 days.

(21) Appl. No.: 17/888,006

(22) Filed: Aug. 15, 2022

(65) Prior Publication Data

US 2023/0122242 A1   Apr. 20, 2023

Related U.S. Application Data

(60) Provisional application No. 63/256,480, filed on Oct. 15, 2021.

(51) Int. Cl.
| | |
|---|---|
| *H01L 23/367* | (2006.01) |
| *H01L 21/762* | (2006.01) |
| *H01L 25/065* | (2023.01) |

(52) U.S. Cl.
CPC .... *H01L 23/3675* (2013.01); *H01L 21/76289* (2013.01); *H01L 25/0655* (2013.01)

(58) Field of Classification Search
CPC ........... H01L 23/3675; H01L 21/76289; H01L 25/0655; H01L 23/15; H01L 23/36; H01L 25/072; H01L 25/16; H01L 23/3677

See application file for complete search history.

(56) References Cited

U.S. PATENT DOCUMENTS

| | | |
|---|---|---|
| 8,617,927 B1 | 12/2013 | Margomenos et al. |
| 9,214,404 B1 | 12/2015 | Margomenos et al. |

(Continued)

FOREIGN PATENT DOCUMENTS

KR    10-2013-0117329    10/2013

OTHER PUBLICATIONS

P. Chinoy, N. Jain, Ping Li, J. Goodrich and C. Souchuns, "Manufacture of low-loss microwave circuits using HMIC technology," 1994 IEEE MTT-S International Microwave Symposium Digest (Cat. No. 94CH3389-4), San Diego, CA, USA, 1994, pp. 1137-1140 vol. 2. doi:0.1109/MWSYM.1994.33554.

(Continued)

*Primary Examiner* — William B Partridge
*Assistant Examiner* — Ilker Nmn Ozden
(74) *Attorney, Agent, or Firm* — Ladas & Parry, LLP

(57) ABSTRACT

An electronic assembly, having a carrier wafer with a top wafer surface and a bottom wafer surface; an electronic integrated circuit being formed in the carrier wafer and comprising first and second integrated circuit contact pads; said carrier wafer comprising a through-wafer cavity having walls that join said top wafer surface to said bottom wafer surface; first and second component chips held in said through-wafer cavity each by direct contact of at least a side surface of said first and second component chips with a heat conducting attachment material that fills said through-wafer cavity; said first and second component chips comprising respectively at least a first and a second component contact pads; a barrier having a heat conductivity lower than a heat conductivity of said carrier wafer held by said heat conducting attachment material in said through-wafer cavity between said first and said second component chips.

23 Claims, 8 Drawing Sheets

(56) References Cited

U.S. PATENT DOCUMENTS

| | | |
|---|---|---|
| 9,337,124 B1 | 5/2016 | Herrault et al. |
| 9,385,083 B1 | 7/2016 | Herrault et al. |
| 9,508,652 B1 | 11/2016 | Herrault et al. |
| 9,837,372 B1 | 12/2017 | Herrault et al. |
| 10,957,537 B2 | 3/2021 | Herrault |
| 10,998,273 B2 | 5/2021 | Herrault et al. |
| 2002/0110952 A1 | 8/2002 | Gris |
| 2006/0105496 A1 | 5/2006 | Chen |
| 2007/0025092 A1 | 2/2007 | Lee |
| 2008/0224320 A1 | 9/2008 | Palmade |
| 2008/0318360 A1* | 12/2008 | Chen .................. H01L 25/0652 257/E21.597 |
| 2009/0057874 A1* | 3/2009 | Syri .................... H01L 23/3128 257/E23.18 |
| 2011/0140216 A1 | 6/2011 | Qu |
| 2011/0266569 A1 | 11/2011 | Basin |
| 2012/0037935 A1 | 2/2012 | Yang |
| 2013/0168803 A1 | 7/2013 | Haddad |
| 2014/0021610 A1 | 1/2014 | Von Koblinski |
| 2014/0203239 A1 | 7/2014 | Schubert |
| 2016/0111616 A1 | 4/2016 | Margalit |
| 2016/0293557 A1 | 10/2016 | Topak |
| 2016/0308270 A1 | 10/2016 | Ding |
| 2016/0329232 A1 | 11/2016 | Golda |
| 2017/0363589 A1 | 12/2017 | Kumar |
| 2018/0019178 A1 | 1/2018 | Lin |
| 2018/0148328 A1 | 5/2018 | Agache |
| 2020/0294816 A1 | 9/2020 | Herrault |
| 2020/0335480 A1* | 10/2020 | Hwang ............... H01L 23/3675 |
| 2021/0050309 A1* | 2/2021 | Chang ............... H01L 23/49838 |
| 2021/0134693 A1* | 5/2021 | Matsumoto ......... H01L 23/3135 |
| 2021/0233857 A1* | 7/2021 | Herrault ............... H01L 25/165 |

OTHER PUBLICATIONS

"Capabilities and Limits to Form High Aspect-Ratio Microstructures by Molding of Borosilicate Glass" by Amid Amnache et al.; Journal of Microelectromechanical Systems (vol. 28, Issue: 3, Jun. 2019), pp. 432-440; Print ISSN: 1057-7157; Electronic ISSN: 1941-0158.

PCT International Preliminary Report on Patentability (Chapter I) from PCT/US2022/040474 mailed on Apr. 25, 2024.

PCT International Search Report and Written Opinion from PCT/US2019/050384 dated Jan. 20, 2020.

PCT International Preliminary Report on Patentability (Chapter I) with Written Opinion from PCT/US2018/055516 dated Jun. 23, 2020.

From U.S. Appl. No. 16/158,212 (now U.S. Pat. No. 10,998,273), Notice of Allowance mailed on Jan. 8, 2021.

From U.S. Appl. No. 16/158,212 (now U.S. Pat. No. 10,998,273), Office Action mailed on Dec. 4, 2020.

From U.S. Appl. No. 16/158,212 (now U.S. Pat. No. 10,998,273), Office Action mailed on Jul. 29, 2020.

From U.S. Appl. No. 16/158,212 (now U.S. Pat. No. 10,998,273), Office Action mailed on Jan. 16, 2020.

From U.S. Appl. No. 16/158,212 (now U.S. Pat. No. 10,998,273), Office Action mailed on Jul. 26, 2019.

PCT International Search Report and Written Opinion from PCT/US2022/040474 dated Dec. 2, 2022.

Extended European Search Report from corresponding EPO Patent Application No. 22881526.2 dated Aug. 1, 2025.

* cited by examiner

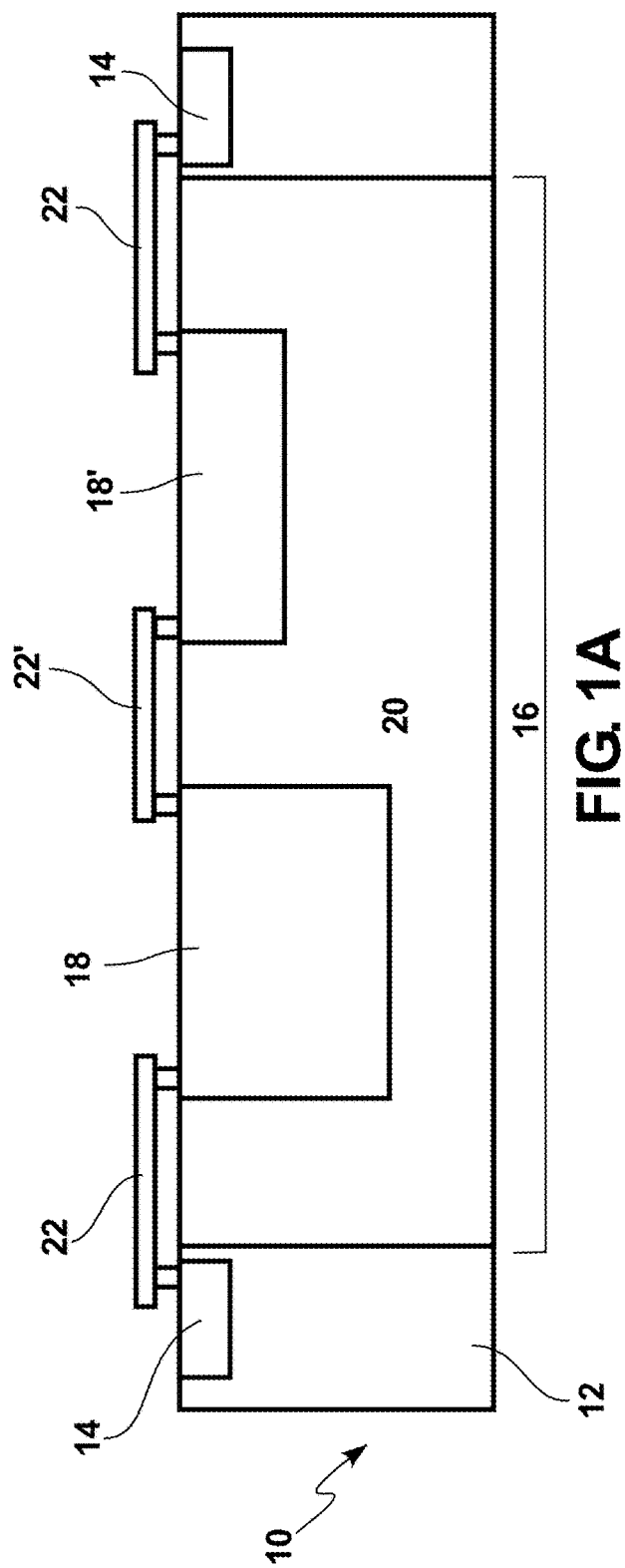
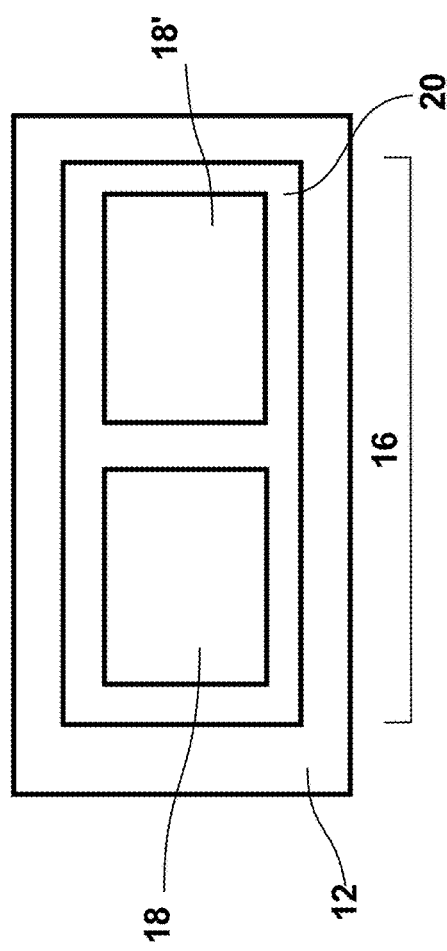

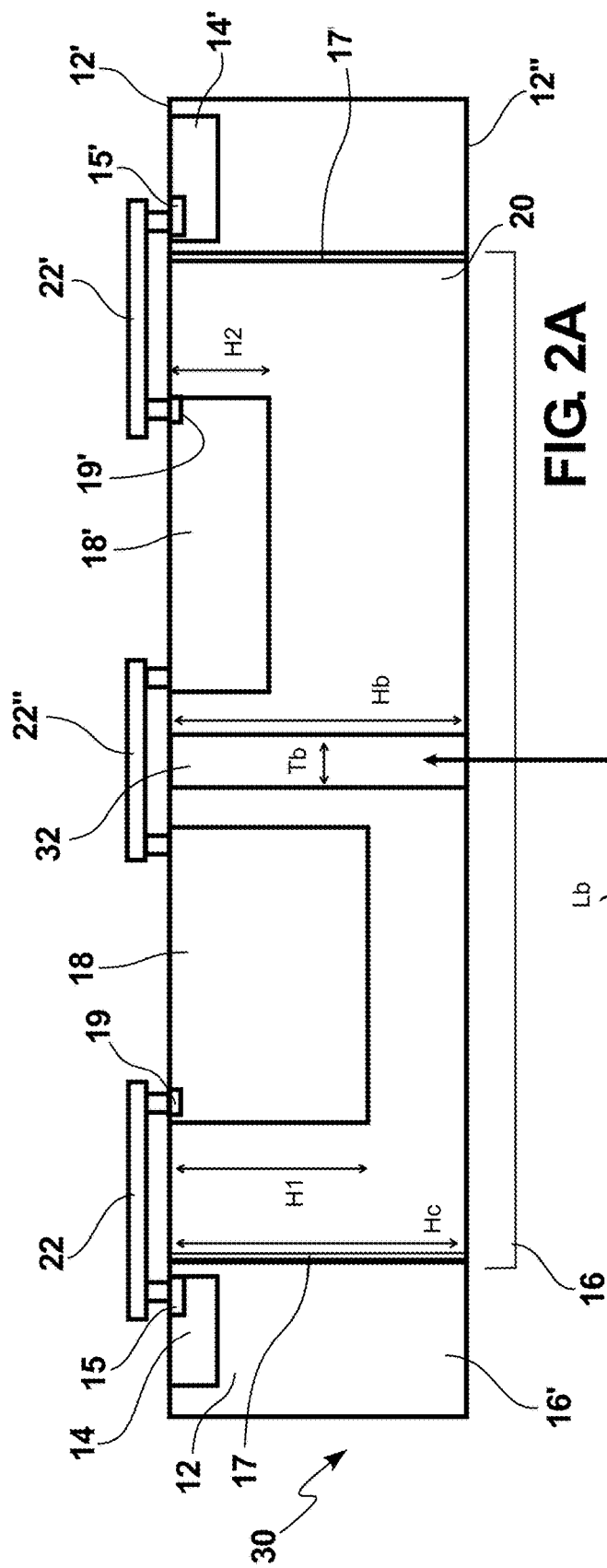
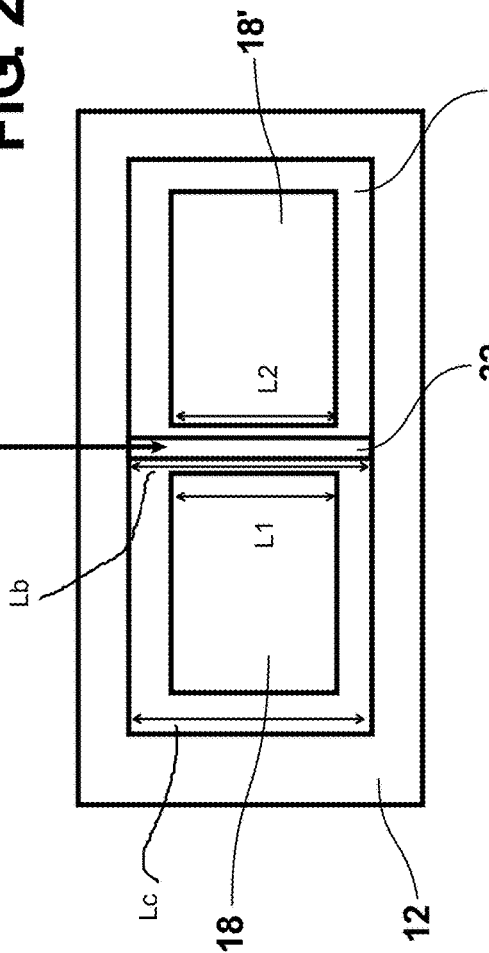
FIG. 2A
FIG. 2B

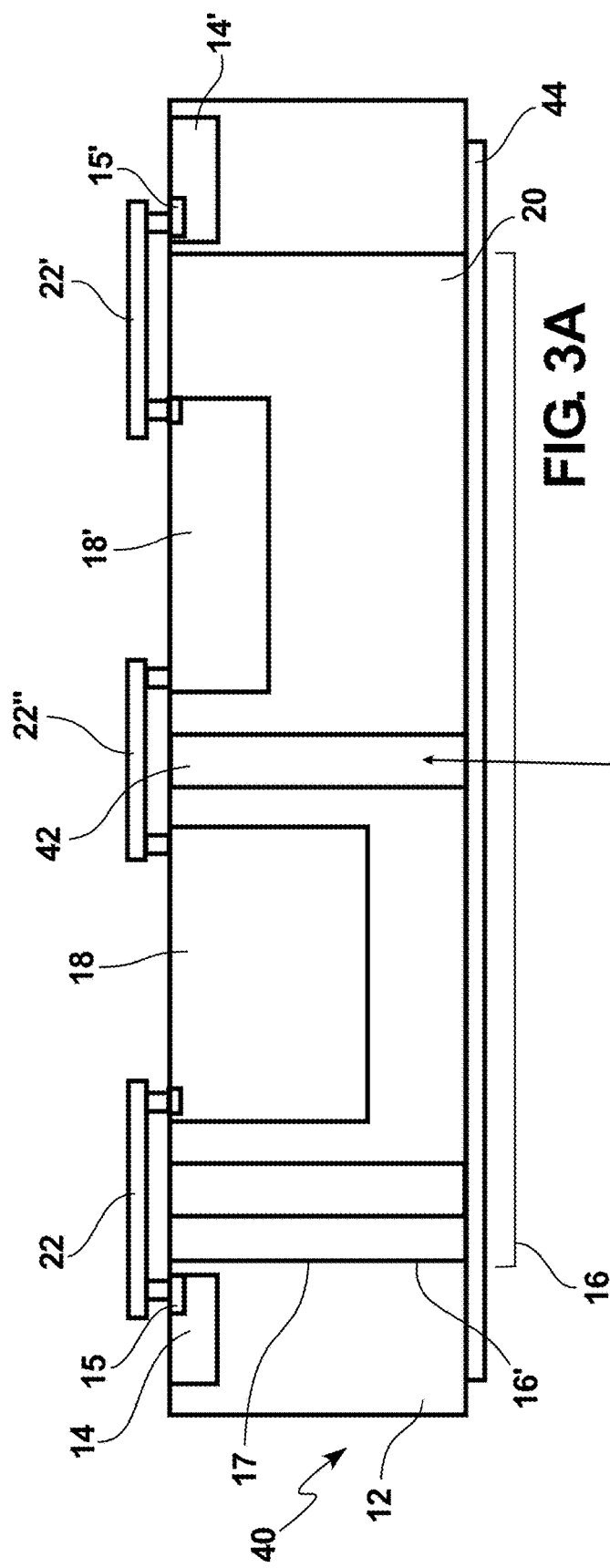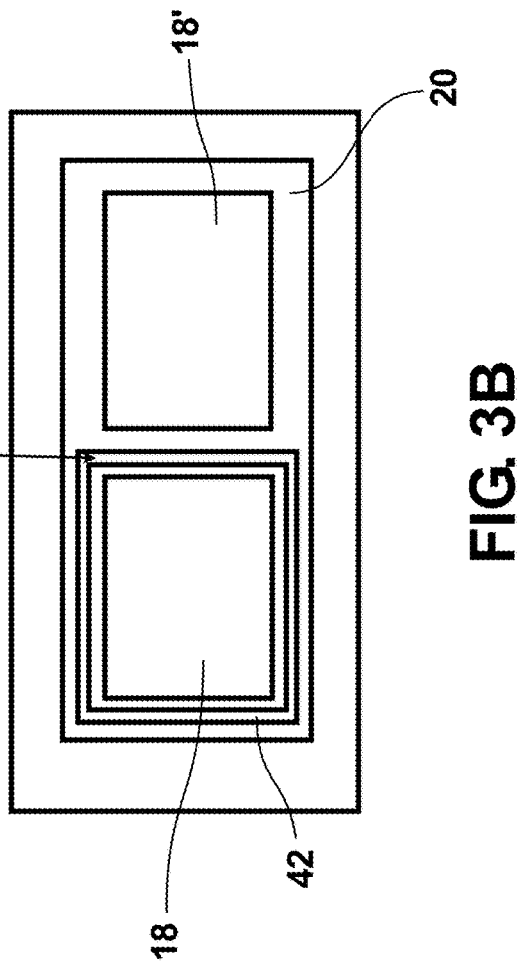

Temperature : °C

| Power/Temp. | Reference | Cladding (Silicon) | Slit (air) | Slit (glass) | Frame (air) | Frame (glass) |
|---|---|---|---|---|---|---|
| 10W | 43.695 | 43.268 | 34.683 | 34.950 | 34.266 | 34.659 |
| 30W | 91.084 | 89.803 | 64.048 | 64.851 | 62.798 | 63.976 |
| 60W | 162.168 | 159.606 | 108.097 | 109.702 | 105.596 | 107.951 |
| 90W | 233.252 | 229.408 | 152.145 | 154.553 | 148.393 | 151.927 |

FIG. 6

THERMAL ISOLATION BETWEEN EMBEDDED MECA MODULES

RELATED APPLICATIONS

This application relates to U.S. Pat. No. 10,998,273; which is hereby incorporated by reference. This application claims priority of U.S. provisional application No. 63/256,480, filed on Oct. 15, 2021, which is hereby incorporated by reference in its entirety.

TECHNICAL FIELD

This presentation relates to electronic assemblies; in particular electronic assemblies comprising one or more microelectronic components integrated into a microelectronic wafer fabricated separately, wherein at least one of said integrated microelectronic components produces heat capable of decreasing the performance of the other integrated microelectronic components.

BACKGROUND

Electronic assemblies, or hybrid circuits, comprise microelectronic circuits fabricated separately and assembled together so as to form a single component, which can itself be encapsulated in an electronic circuit package. Assembling microelectronic circuits fabricated separately allows one to, for example, test all the microelectronic circuits separately, prior to assembling them, which, in turn enables improved fabrication yields of the final component. This capability is particularly significant if some of the microelectronic circuits fabricated separately are difficult and/or expensive to manufacture. Assembling microelectronic circuits fabricated separately also allows one to combine microelectronic circuits made of different materials and/or using different manufacturing processes, into a single final component. This capability can lead to higher circuit performance.

The reference P. Chinoy, N. Jain, Ping Li, J. Goodrich and C. Souchuns, "Manufacture of low-loss microwave circuits using HMIC technology," 1994 *IEEE MTT-S International Microwave Symposium Digest* (*Cat. No.* 94CH3389-4), San Diego, CA, USA, 1994, pp. 1137-1140 vol. 2. doi: 10.1109/MWSYM.1994.335544", discloses a low-cost, batch-processed, surface-mountable, microwave manufacturing technology that provides hybrid-type flexibility with monolithic-type passive components with repeatability and precision. The reference discloses, in particular, power amplifier circuits with high power-added efficiencies and reduced size paving the way for low-cost, high-performance circuits for wireless communication markets.

U.S. Pat. Nos. 8,617,927 and 9,214,404, which are hereby incorporated by reference in their entirety, disclose a method and apparatus for mounting microelectronic chips to a thermal heat sink. The chips are arranged in a desired configuration with their active faces all facing a common direction and with their active faces defining a common planar surface for all of said chips. A metallic material is applied to the chip, preferably by electroplating to backsides of the chips, the metallic material being electro-formed thereon and making void-free contact with the backsides of the chips.

U.S. Pat. No. 9,508,652, which is hereby incorporated by reference in its entirety, discloses a method for wafer level packaging that includes forming one or more die, forming a plated metal ring (PMR) on each die, forming a cover wafer (CW), the CW having one or more plated seal rings, forming a body wafer (BW), the BW having cavities and a metal layer on a first side of the BW, aligning a respective die to the CW so that a PMR on the respective die is aligned to a respective plated seal ring (PSR) on the CW, bonding the PMR on the respective die to the respective PSR, aligning the BW to the CW so that a respective cavity of the BW surrounds each respective die bonded to the CW and so that the metal layer on the BW is aligned with at least one PSR on the CW, and bonding the metal layer on the first side of the BW to the PSR on the CW. Each PMR has a first height and each PSR has a second height.

U.S. Pat. Nos. 9,837,372 and 9,385,083, which are hereby incorporated by reference in their entirety, disclose an interconnect and manufacturing method for electrically coupling pads formed on adjacent chips (or on packaging material adjacent the chips) with an electrically conductive heat sink being disposed between the pads, the interconnect comprising a metallic membrane layer disposed between two adjacent pads and disposed, or bridging, over the electrically conductive heat sink so as to avoid making electrical contact with the electrically conductive heat sink. An electroplated metallic layer is disposed on the metallic membrane layer. Multiple interconnects can be formed in parallel using manufacturing techniques compatible with wafer level fabrication of the interconnects. The interconnects preferably follow a smooth curve to electrically connect adjacent pads and following that smooth curve they bridge over the intervening electrically conductive heat sink material in a predictable fashion.

U.S. Pat. No. 9,337,124, which is hereby incorporated by reference in its entirety, discloses a method for forming a wafer level heat spreader that includes providing a mesh wafer, the mesh wafer having a plurality of openings and mesh regions between the openings, bonding the mesh wafer to a backside of an integrated circuit (IC) wafer, the IC wafer comprising a plurality of circuits; and electroplating a heat sink material through the plurality of openings and onto to the backside of the IC wafer.

U.S. Pat. No. 10,998,273; which is hereby incorporated by reference, discloses an electronic assembly and manufacturing method thereof. As for the example illustrated in FIGS. 1A (cross-section view) and 1B (top view; not to scale, connections not shown) the electronic assembly 10 comprises a carrier wafer 12 with an electronic integrated circuit 14 formed therein and with a through-wafer cavity 16; at least one component chip (18, 18') being held in said through-wafer cavity 16 by direct contact with an attachment metal 20 that fills at least a portion of said through-wafer cavity 16 (the full cavity is filled by metal 20 in FIGS. 1A and 1B); said component chip (18, 18') further being electrically connected 22 to said integrated circuit 14. One or more conductors 22" can connect pads (not shown) on the different component chips (18, 18'). The heat conducting attachment metal 20 advantageously allows evacuating the heat generated by the operation of the component chip (18, 18'). However, the Inventor has noted that when at least one high power component chip (e.g. 18) is held by the heat conducting attachment material with other component chips (e.g. 18') in a same wafer cavity 16, as illustrated in FIGS. 1A, 1B, a thermal cross talk may appear between the high power component chip (e.g. 18) and the other component chips (e.g. 18') and detrimentally affect the operation of the other component chips (e.g. 18'). Chips 18 and 18' can have different form factors and can be made using fifferent materials and/or technologies.

There exists a need for an electronic assembly or hybrid component that allows mitigating the thermal crosstalk between chips attached by metal in a same wafer cavity.

SUMMARY

Embodiments of the presentation comprise an electronic assembly, having: —a carrier wafer with a top wafer surface and a bottom wafer surface; an electronic integrated circuit being formed in the carrier wafer and comprising first and second integrated circuit contact pads on one of the top wafer surface and the bottom wafer surface; said carrier wafer comprising a through-wafer cavity having walls that join said top wafer surface to said bottom wafer surface; —a first component chip with a first component chip top surface, a first component chip bottom surface and first component chip side surfaces, the first component chip being held in said through-wafer cavity by direct contact of at least a side surface of said first component chip with an heat conducting attachment material that fills at least a portion of said through-wafer cavity; said first component chip comprising at least one first component contact pad on one of said first component chip top surface and said first component chip bottom surface; —a second component chip with a second component chip top surface, a second component chip bottom surface and second component chip side surfaces, the second component chip being held in said through-wafer cavity by direct contact of at least a side surface of said second component chip with said heat conducting attachment material; said second component chip comprising at least one second component contact pad on one of said second component chip top surface and said second component chip bottom surface; wherein a barrier having a heat conductivity lower than a heat conductivity of said carrier wafer is held by said heat conducting attachment material in said through-wafer cavity between said first and said second component chips; and having at least one of: —a first conductor connecting said first integrated circuit contact pad and said first component contact pad; and—a second conductor connecting said second integrated circuit contact pad and said second component contact pad. According to an embodiment, the heat conducting attachment material can be a metal. Such embodiments are for example illustrated in FIGS. 2A-B, 3A-B and 4B-D.

According to embodiments of this presentation, the first and second component chips have first and second heights and the barrier has a barrier height at least as large as the smallest of the first and second heights. Such embodiments are for example illustrated in FIGS. 2A and 3A.

According to embodiments of this presentation, the through-wafer cavity has a cavity height and the barrier height is equal to the cavity height. Such embodiments are for example illustrated in FIGS. 2A and 3A.

According to embodiments of this presentation, the first and second component chips have each a side closest to the barrier that have first and second lengths, and wherein the barrier has a barrier length at least as large as the smallest of said first and second lengths. Such embodiments are for example illustrated in FIGS. 2B, 3B and 4B-D.

According to embodiments of this presentation, the through-wafer cavity has a cavity length and the barrier length is equal to the cavity length. Such embodiments are for example illustrated in FIGS. 2B and 4B-C.

According to embodiments of this presentation, the barrier is arranged parallel to at least two side surfaces of one of the first and second component chips. Such embodiments are for example illustrated in FIGS. 3A-B and 4D.

According to embodiments of this presentation, the barrier surrounds one of the first and second component chips. Such embodiments are for example illustrated in FIGS. 3A-B and 4D.

According to embodiments of this presentation, the barrier material comprises one of air and glass. Such embodiments are for example illustrated in FIGS. 2A-B, 3A-B and 4B-D. Ceramics can also be used where appropriate. According to embodiments of this presentation, the barrier material can comprise any material with a chemical resistance of the same order as air or glass, or having chemical inertness, and that has a low thermal conductivity (10 W/m K or below)

According to embodiments of this presentation, the barrier has a thickness equal to one fifth or more of the distance between the first and second component chips.

According to embodiments of this presentation, the heat conducting attachment material holds the first and second component chips such that the first and second component chips top surfaces are flush with the top wafer surface. Such embodiments are for example illustrated in FIGS. 2A and 3A.

According to embodiments of this presentation, a metal layer covers at least a portion of the bottom wafer surface as well as the heat conducting attachment material in the cavity. Such embodiments are for example illustrated in FIG. 3A.

According to embodiments of this presentation, the walls of the through-wafer cavity are covered with a dielectric layer. Such embodiments are for example illustrated in FIGS. 2A-B, 3A-B and 4B-D.

According to embodiments of this presentation, the attachment material contacts at least most of each first and second component chips side surfaces. Such embodiments are for example illustrated in FIGS. 2A-B, 3A-B and 4B-D.

According to embodiments of this presentation, the carrier wafer and at least the first or second component chips are made of different materials. Such embodiments are for example illustrated in FIGS. 2A-B, 3A-B and 4B-D.

According to embodiments of this presentation, at least one of the first and second component chips is an integrated circuit chip comprising one or more transistors.

According to embodiments of this presentation, the carrier wafer and at least one of the first and second component chips have a different height. Such embodiments are for example illustrated in FIGS. 2A and 3A.

Other embodiments of this presentation relate to a method of manufacturing an electronic assembly, comprising: providing a first component chip having a first component chip top surface, a first component chip bottom surface and first component chip side surfaces; said first component chip comprising at least one first component contact pad on said first component chip top surface; providing a second component chip having a second component chip top surface, a second component chip bottom surface and second component chip side surfaces; said second component chip comprising at least one second component contact pad on said second component chip top surface; providing a handle wafer having a first surface; attaching said first and second component chips top surfaces to said first surface of said handle wafer; providing a carrier wafer having a top wafer surface and a bottom wafer surface; forming in the carrier wafer an electronic integrated circuit having first and second integrated circuit contact pads on the top wafer surface; forming in the carrier wafer a through-wafer cavity having walls that join said top wafer surface to said bottom wafer surface; attaching said top wafer surface to said first surface of said handle wafer such that said first and second component chips are arranged within said through-wafer cavity; positioning a barrier structure having a heat conductivity lower than a heat conductivity of said carrier wafer in said through-wafer cavity between the first and second component chips; filling at least a portion of said through-wafer cavity with an heat conducting attachment material so as to hold the first and second component chips in said through-wafer cavity by direct contact of at least a side surface of said first and second component chips with said heat conducting attachment material and so as to hold said barrier structure between the first and second component chips by direct contact with said heat conducting attachment material; detaching the handle wafer from the first and second component chips top surface and the top wafer surface; and at least one of forming a first conductor between the first integrated circuit contact pad and said first component contact pad; and forming a second conductor between the second integrated circuit contact pad and said second component contact pad. According to an embodiment of said presentation, said positioning a barrier structure having a heat conductivity lower than a heat conductivity of said carrier wafer in said through-wafer cavity between the first and second component chips comprises attaching the barrier structure to said first surface of said handle wafer and/or to at least a wall of said through-wafer cavity. Such embodiments are for example illustrated in FIG. 7.

According to embodiments of this presentation, said filling at least a portion of said through-cavity with said heat conducting attachment material comprises depositing said heat conducting attachment material by electroplating. Such embodiments are for example illustrated in FIG. 7.

According to embodiments of this presentation, the barrier is arranged parallel to at least two side surfaces of one of the first and second component chips.

According to embodiments of this presentation, the barrier surrounds one of the first and second chips.

According to embodiments of this presentation, the positioning of the barrier structure between the first and second component chips comprises positioning a sacrificial structure between the first and second component chips which can be removed, after said filling at least a portion of said through-wafer cavity with an attachment material, to provide a barrier structure made out of air.

Another embodiment of this presentation comprises an electronic assembly, having a carrier wafer with a top wafer surface and a bottom wafer surface; an electronic integrated circuit being formed in the carrier wafer and comprising first and second integrated circuit contact pads; said carrier wafer comprising a through-wafer cavity having walls that join said top wafer surface to said bottom wafer surface; first and second component chips held in said through-wafer cavity each by direct contact of at least a side surface of said first and second component chips with a heat conducting attachment material that fills said through-wafer cavity; said first and second component chips comprising respectively at least a first and a second component contact pads; a barrier having a heat conductivity lower than a heat conductivity of said carrier wafer held by said heat conducting attachment material in said through-wafer cavity between said first and said second component chips.

FIGURES

The above features will now be described in more details in relation with the following figures, wherein:

FIGS. 1A and 1B illustrate a cross section and a top view of a known assembly.

FIGS. 2A and 2B illustrate a cross section and a top view of an assembly according to an embodiment of this presentation.

FIGS. 3A and 3B illustrate a cross section and a top view of an assembly according to another embodiment of this presentation.

FIG. 6 is a table showing the results in FIG. 5.

DETAILED DESCRIPTION

Figure 4A:
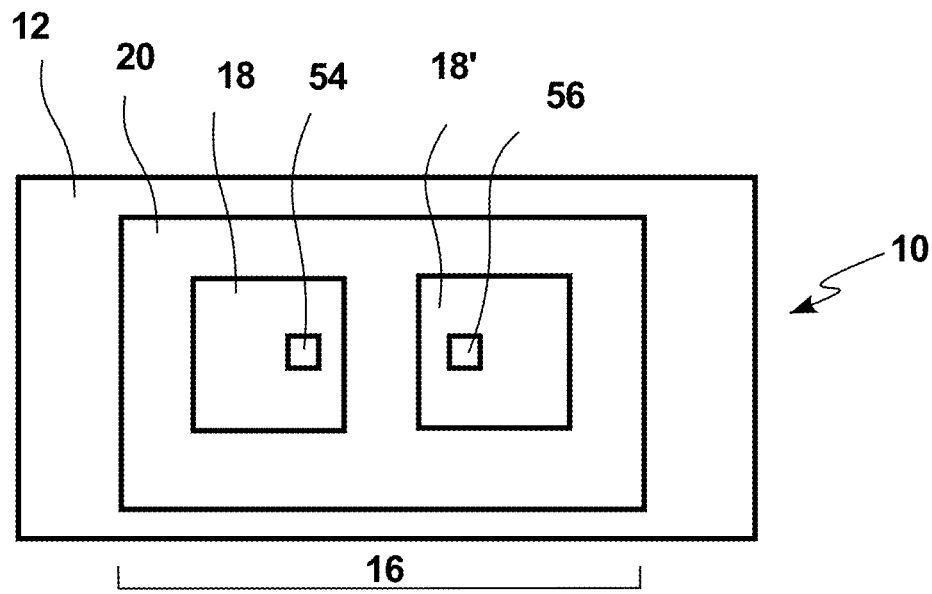
FIGS. 4A to 4D illustrate a top view of two simulated assembly embodiments of this presentation as well as two reference assemblies.

The following description is presented to enable one of ordinary skill in the art to make and use the teachings of this presentation and to incorporate them in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of embodiments of this presentation. However, it will be apparent to one skilled in the art that such embodiments may be practiced without necessarily being limited to these specific details.

All the features disclosed in this presentation, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112(f). In particular, the use of "step of" or "act of" in the claims herein is not intended to invoke the provisions of 35 U.S.C. 112, Paragraph 6.

An electronic assembly according to embodiments of this presentation integrates high-performance integrated circuits, such as GaN RF MMICs, into carrier wafers having integrated circuits, such as silicon-based integrated circuits, in a manner that is inexpensive and has high manufacturing yields and short manufacturing cycles.

According to embodiments of this presentation, the high performance integrated circuit or component can comprise III-V transistors or integrated circuits and they can be integrated, eventually together with resistors, inductors, capacitors and matching networks, into the carrier wafers.

Generally, embodiments of this presentation comprise an apparatus/assembly with one or more chips held by an heat conducting attachment material in a through-wafer cavity of a carrier wafer, said apparatus having all the features of an apparatus/assembly as described in U.S. Pat. No. 10,998, 273, which is hereby incorporated by reference. Additionally, at least one low-thermal conductivity component, or barrier, is arranged in the cavity between two of the chips held by the metal. This allows thermally isolating the two chips and thus mitigating thermal crosstalk between the two chips. As such, the metal-held chips benefit from the intimate contact with the heat conducting attachment material, which operates as a high-thermal conductivity heat spreader, but without being heated by neighboring chips. Alternatively, or additionally, the barrier can be arranged in the cavity between one chip held by the metal and a wall of the cavity to mitigate thermal crosstalk between the chip and the carrier wafer (which itself can comprise one or more integrated circuits). According to some embodiments of this presentation, the barrier can surround the chip to be isolated. The barrier can have a height identical to the height of the cavity. The cavity can comprise a single chip held in metal, the barrier isolating at least one side of the chip from a wall of the cavity.

Overall, embodiments of this presentation provide an additional thermal isolation of chips or modules otherwise embedded in metal as disclosed in U.S. Pat. No. 10,998,273, while maintaining a core feature of such metal embedding (the metal acting as a thermal heat spreader). Multi-chip modules as disclosed in U.S. Pat. No. 10,998,273 may comprise at least one metal-held high power chip (which dissipates a lot of heat) next to a lower power metal-held chip (which dissipates less heat than its neighbor). While the metal holding the high-power chip provides a tool to operate the high-power chip more efficiently, the heat generated by the high-power chip may nevertheless affect negatively the neighbor lower power chip through thermal cross talk (due to the high thermal conductivity of the embedding metal). Embodiments of this presentation provide the advantage of holding the chips in metal while providing thermal isolation between chips.

Embodiments of this presentation also comprise methods of manufacturing the electronic assemblies described above. Such methods can comprise all the steps of the methods disclosed in U.S. Pat. No. 10,998,273, and additionally comprise steps for providing at least one barrier between two chips held in metal (or between one chip held in metal and the walls of the cavity filled with metal).

A "MECA" technology (Metal Embedded Chip Assembly) such as disclosed in disclosed in U.S. Pat. No. 10,998,273 co-integrates multiple chips into compact modules with integrated heat spreaders and interconnects (FIG. 1). While such technology has proven to improve thermal dissipation by providing direct contact between the chip and a high-thermal conductivity heat spreader (e.g., electroplated copper), as shown in FIGS. 1A and 1B, described above, such technology does not address thermal cross-talk between chips. In some cases, one can find low-power chips next to high-power chips, and the high-power chip can potentially heat up the low-power chip, impacting negatively the performance of the low-power chip.

To address this crosstalk issue, this presentation provides for adding at least one low-thermal-conductivity spacer or barrier into the "MECA" modules. FIGS. 2A and 2B illustrate an exemplary embodiment of an assembly 30 according to this presentation using a "slit" concept between the metal-held chips 18, 18', where a thermal barrier 32 is embodied by a slit filled with a material having a conductivity lower than the conductivity of the carrier wafer material (for example with air or glass, in particular in case the carrier wafer is Silicon). FIGS. 2A and 2B are identical with FIGS. 1A and 1B, respectively, except that thermal barrier 32 is arranged in metal 20 between the component chips 18, 18'. As illustrated in FIGS. 2A, 2B, an embodiment of this presentation comprises an electronic assembly 30 having a carrier wafer 12 with a top wafer surface 12' and a bottom wafer surface 12"; an electronic integrated circuit 14, 14' being formed in the carrier wafer 12 and comprising first (15) and second (15') integrated circuit contact pads on one of the top wafer surface and the bottom wafer surface (top wafer surface illustrated); said carrier wafer 12 comprising a through-wafer cavity 16 having walls 16' that join said top wafer surface 12' to said bottom wafer surface 12".

According to embodiments of this presentation, assembly 30 further comprises a first component chip 18 with a first component chip top surface, a first component chip bottom surface and first component chip side surfaces, the first component chip 18 being held in said through-wafer cavity 16 by direct contact of at least a side surface of said first component chip 18 with a heat conducting attachment material 20 (e.g. a metal) that fills at least a portion of said through-wafer cavity 16; said first component chip 18 comprising at least one first component contact pad 19 on one of said first component chip top surface and said first component chip bottom surface (top surface illustrated); a second component chip 18' with a second component chip top surface, a second component chip bottom surface and second component chip side surfaces, the second component chip 18' being held in said through-wafer cavity 16 by direct contact of at least a side surface of said second component chip 18' with said heat conducting attachment material 20; said second component chip 18' comprising at least one second component contact pad 19' on one of said second component chip top surface and said second component chip bottom surface; wherein a barrier 32 having a heat conductivity lower than a heat conductivity of said carrier wafer 12 (and also lower than a heat conductivity of the material 20) is held by said heat conducting attachment material 20 in said through-wafer cavity 16 between said first and said second component chips 18 and 18'.

Two component chips 18, 18' are illustrated in FIGS. 2A, 2B but more than two component chips can be embedded in material 20, for example with a barrier 32 between each of the component chips to prevent thermal cross talk between said component chips. According to embodiments of this presentation, a first conductor 22 can connect the first integrated circuit contact pad 15 and the first component contact pad 19; and/or a second conductor 22' can connect the second integrated circuit contact pad 15' and the second component contact pad 19'.

According to an embodiment of this presentation, the first component chip 18 and second component chip 18' have first and second heights H1 and H2 and the barrier 32 has a barrier height Hb at least as large as the smallest of the first and second heights H1, H2. According to an embodiment of this presentation, the through-wafer cavity 16 has a cavity height Hc and the barrier height Hb is equal to the cavity height Hc.

According to an embodiment of this presentation, and as shown for example in FIG. 2B, the first and second component chips 18, 18' have each a side closest to the barrier 32 that have first and second lengths L1, L2, and the barrier 32 has a barrier length Lb at least as large as the smallest of said first and second lengths L1, L2. According to an embodiment, the through-wafer cavity 16 has a cavity length Lc and the barrier length is equal to the cavity length.

In the illustration of FIG. 2B, the barrier has a length such that the barrier extends from wall to wall in the cavity. The barrier however can have a smaller length.

According to an embodiment of this presentation, the barrier 32 has a thickness Tb at least equal to one fifth of the distance between the first component chip 18 and the second component chip 18'.

As illustrated in FIG. 2A, the heat conducting attachment material 20 can hold the first and second component chips (18, 18') such that the first and second component chips top surfaces are flush with the top wafer surface. According to an embodiment of this presentation, the walls 16' of the through-wafer cavity 16 are covered with a dielectric layer 17 having a material and a thickness chosen to electrically insulate material 20 from the integrated circuits 14, 14' in carrier wafer 12.

According to an embodiment of this presentation, the attachment material 20 can contact less than half of the side surfaces of each of the first and second component chips (18, 18'). However, as illustrated in FIGS. 2A, 2B, attachment material 20 preferably contacts more than half of the side surfaces of the first and second component chips (18, 18'). The carrier wafer 12 and at least the first or second component chips 18, 18' can be made of different materials. At least one of the first and second component chips 18, 18' can be an integrated circuit chip comprising one or more transistors (the transistors are not shown).

FIGS. 3A and 3B illustrate an exemplary embodiment of an assembly 40 according to this presentation using a "frame" concept where a heat-producing chip (18) is surrounded by a barrier 42 of a material having a conductivity lower than the conductivity of the carrier wafer material 12 (for example with air or glass, in particular in case the carrier wafer is Silicon). FIGS. 3A and 3B are identical to FIGS. 2A and 2B, except that the single-wall barrier 32 of FIGS. 2A and 2B is replaced by a multiple-walls barrier 42 (barrier 42 has four walls in FIGS. 3A and 3B and surrounds completely component chip 18, but according to some embodiments, barrier 42 can comprise only two walls or more and surround only partially chip 18). Only one barrier 42 is illustrated in FIGS. 3A and 3B around one chip 18, but assembly 40 can comprise one or more chips 18 surrounded each by one or more barriers 42.

In case the barrier 42 is as high as the cavity 16, barrier 42 may be filled by a solid material such as glass or ceramic. A "frame" barrier 42 allows forming an individual heat spreader with low thermal cross-talk around heat-producing chips. The walls of the "frame" barrier 42 can have the same length and height as in FIGS. 2A and 2B. As illustrated in FIGS. 3A/3B, a metal layer 44 can cover at least a portion of the bottom surface of the carrier wafer 12 as well as at least a portion of the bottom surface of the material 20 (e.g. metal) that fills the carrier wafer cavity 16, thus facilitating heat evacuation by the material 20 in the cavity 16. Advantageously, when such a metal layer 44 is present, it can hold together the portions of material 20 that lie on both sides of barrier 42, in particular in case barrier 42 is filled with a non solid material such as air.

Figure 4B:
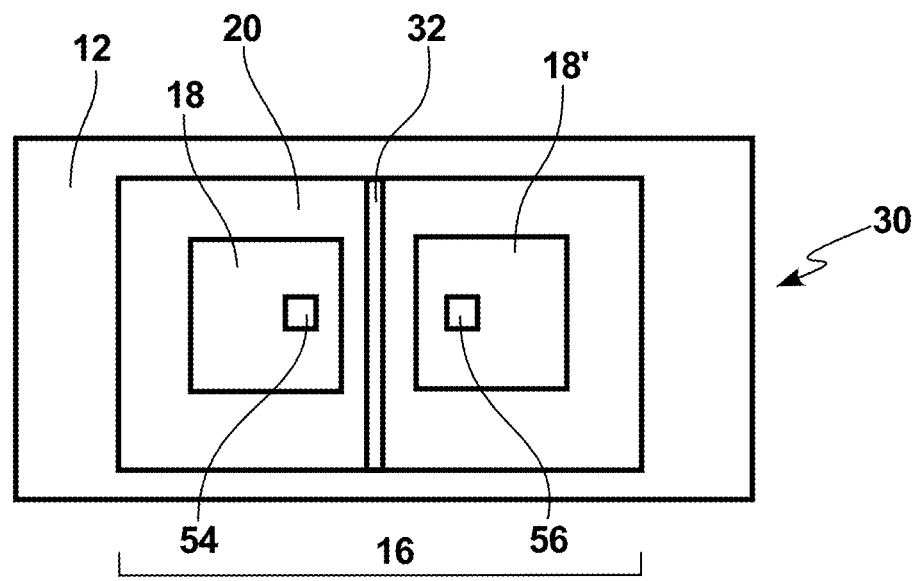
Figure 4C:
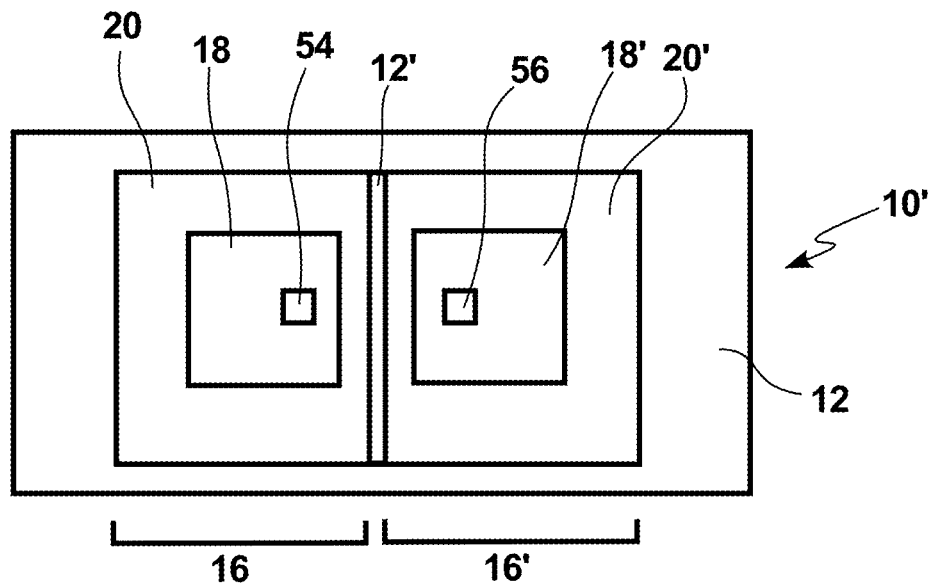
Figure 4D:
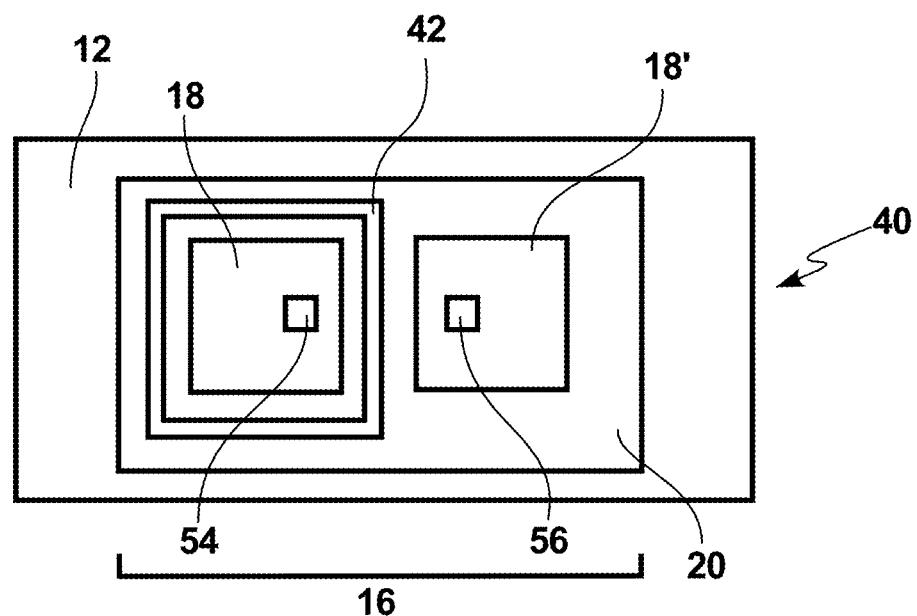
Figure 5:
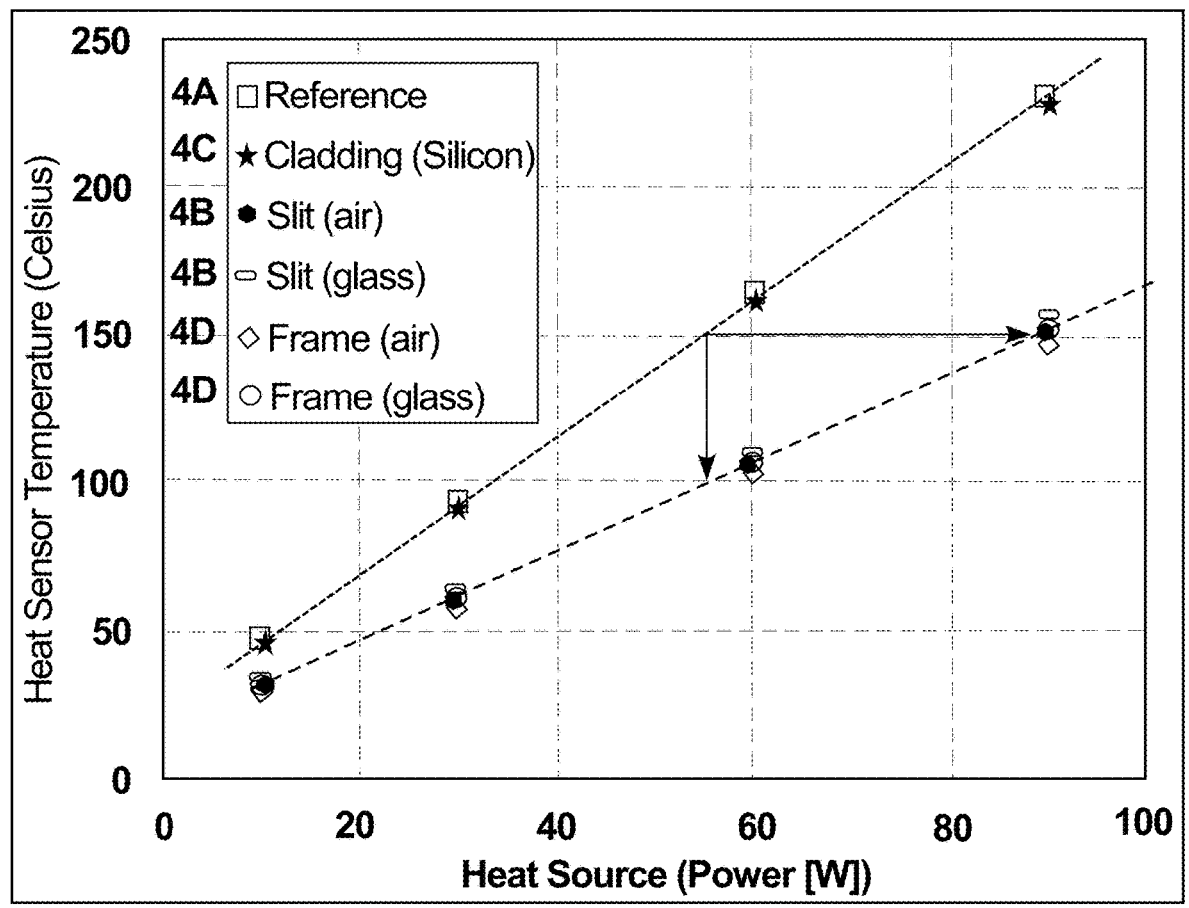
FIG. 5 is a graph illustrating the results of the simulation of the assemblies in FIGS. 4A-D.

In an example where the chips were 100 um apart, the inventor modeled glass (and air) slits/barrier 32 that are 20 um wide (and 300 um high, which can be the same height as the cavity). Two exemplary embodiments 30, 40 of this presentation that were subject to a simulation by the Inventor are illustrated in FIGS. 4B and 4D. Each embodiment comprises two chips 18, 18' that have each a surface of 0.5×0.5 mm, separated by a distance of 100 um, and both embedded in a metal 20 (copper) in a same 300 um—deep cavity 16. The chips 18, 18' were chosen to mimic RF GaN integrated circuits having transistors. In these chips, the heat is generated mainly by the area of the transistors. The Inventor simulated a heat source 54 on one chip (18), and a heat sensor 56 (or thermal sensor) on the other chip (18') to measure the cross talk between chips. In particular, the dissipated power from one chip was scaled to match high power densities observed in GaN MMICs. In particular, the second chip contained a thermal sensor where the peak temperature is tracked as a function of the power dissipated in the first chip. The simulation was performed in a steady state. The backside of the assembly was held at 25 C. Power was applied to the heat source 54 and temperature was measured in the thermal sensor 56. A first reference model 10, illustrated in FIG. 4A, was also simulated. The first reference model 10 consists of the 2 chips 18, 18' as detailed above embedded in the copper 20. No low-thermal conductivity component/barrier 32 or 42 was embedded in the metal 20 between the chips 18, 18' of the reference model 10. A second reference model 10', illustrated in FIG. 4C, was also simulated. In the second reference model the 2 chips 18. 18' detailed above are embedded in metal 20, 20' each in a different cavity 16, 16' of the carrier wafer separated by a portion 12' of the carrier wafer 12. The embodiment in FIG. 4B uses a slit design where the chips 18, 18' are separated by a low-thermal-conductivity component/barrier 32 (glass and air barriers were simulated). The slit that forms barrier 32 can be of any shape for modules with more than 2 chips. According to an embodiment, the barrier 32 can comprise at least two walls arranged each parallel to a different side surface of one of the first and second component chips. The embodiment of FIG. 4D uses a low-thermal-conductivity frame/barrier 42 around the power chip 18 to thermally isolate it from the rest of the module/assembly 40. The results of the simulations are plotted in FIG. 5 and summarized in FIG. 6. It appears that in the case where each chip is in a separate cavity (or "silicon cladding" case), there is only negligible thermal isolation. Indeed, the measured temperature on the thermal sensor chip in this configuration is comparable to the measured temperature on the thermal sensor chip in the reference configuration. This is expected since the silicon of the carrier wafer has a reasonably high thermal conductivity (100 W/mK). FIG. 5 illustrates the results of the simulations for FIGS. 4A to 4D. Two simulations (one for an air barrier, one for a glass barrier) were conducted for each of FIGS. 4B and 4D. The silicon cladding provides negligible thermal isolation when compared against the reference module. This is to be expected since the thermal conductivity of silicon is ~100 W/mK to 350-400 W/mK for a copper heat spreader. However, both the air/glass slits and frames provide a significant reduction in thermal cross-talk. Glass slits and frames provide nearly the same thermal isolation as air. FIG. 5 shows that the embodiments of this presentation in FIGS. 4B and 4D, with glass and air slit and glass and air frame barriers, show significant reduction in the temperature measured on the thermal sensor chip. FIG. 5 also shows that the frame design, in FIG. 4D, provides slightly better thermal isolation since it fully encloses the high-power chip 18.

As an example, the thermal isolation design provides a reduction in peak temperature of 50 C at 55 W of input power (from 150 C for the reference model, down to 100 C for a thermally-isolated MECA package). Conversely, at 150 C of peak temperature in the sensor chip, one can dissipate nearly twice as much power in the power chip (from 55 W to 90 W). These results have significant impact for a module subsystem—either by increasing the performance (more power for the same temperature), or by increasing reliability.

While the air configuration is a better thermal solution, it is more challenging to manufacture. Therefore, a preferred approach to an air barrier is a glass barrier or frame. FIG. 6 summarises in a table the data from FIG. 5

Figure 7:
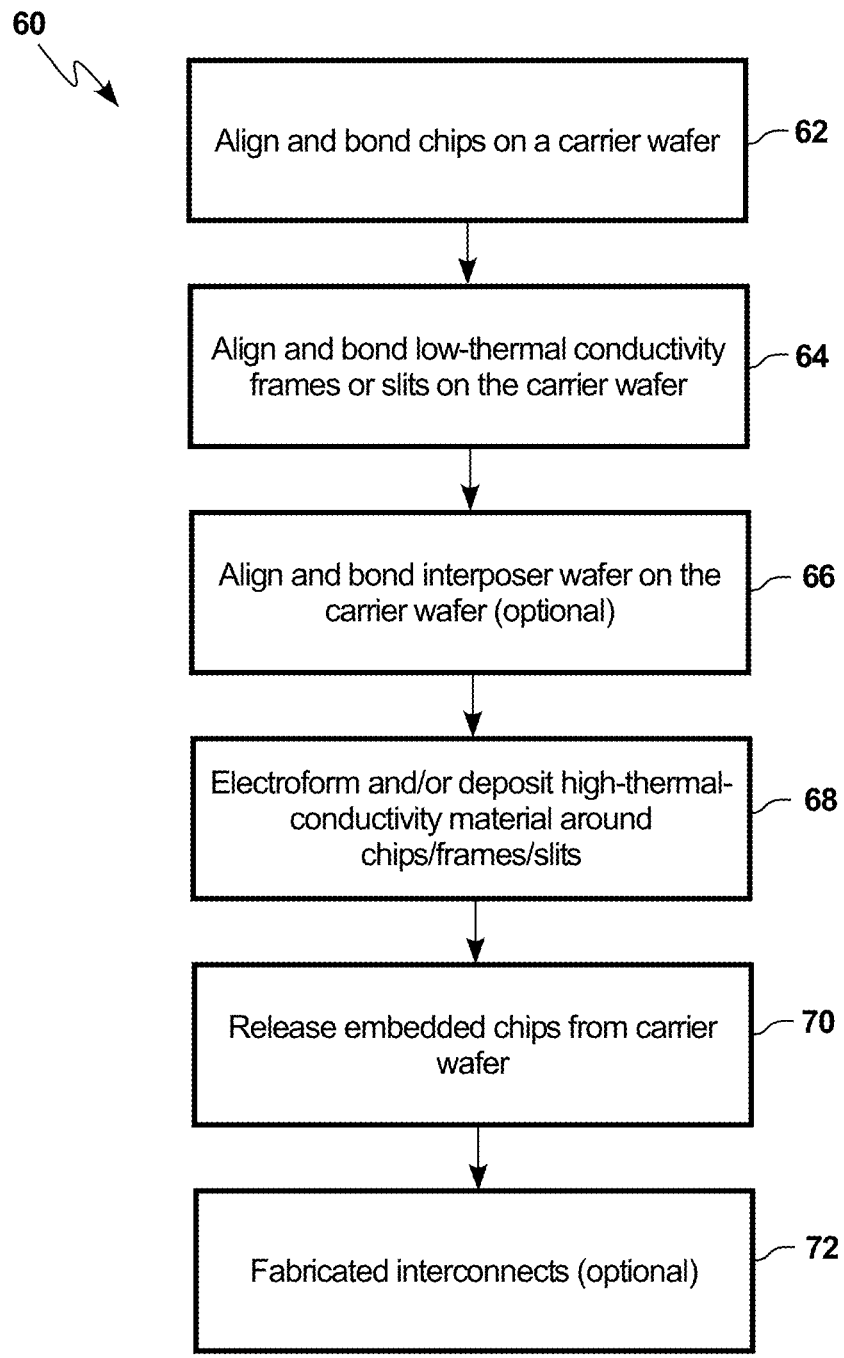
FIG. 7 illustrates a method according to an embodiment of this presentation.

FIG. 7 illustrates a process flow method 60 according to embodiments of this presentation. In this embodiment, the assembly will comprise at least two chips 18, 18' held in a metal 20 with at least one side of each chip in direct contact with metal 20, the chips being separated with at least one low-thermal conductivity component/barrier 32, 42. According to a preferred embodiment, the low-thermal conductivity component/barrier 32, 42 is at least the same height as the integrated metallic heat spreader 20, and has preferably a length as large as the smallest of the facing lengths of the chips 18, 18'.

Method 60 comprises: at step 62, providing a first component chip having a first component chip top surface, a first component chip bottom surface and first component chip side surfaces; said first component chip comprising at least one first component contact pad on said first component chip top surface; providing a second component chip having a second component chip top surface, a second component chip bottom surface and second component chip side surfaces; said second component chip comprising at least one second component contact pad on said second component chip top surface; providing a handle wafer having a first surface, and attaching (aligning and bonding) said first and second component chips top surfaces to said first surface of said handle wafer.

At step 64, positioning (aligning and bonding) a barrier structure having a heat conductivity lower than a heat conductivity of a carrier wafer in said through-wafer cavity between the first and second component chips.

At step 66, providing a carrier wafer having a top wafer surface and a bottom wafer surface; forming in the carrier wafer an electronic integrated circuit having first and second integrated circuit contact pads on the top wafer surface; forming in the carrier wafer a through-wafer cavity having walls that join said top wafer surface to said bottom wafer surface; attaching (aligning and bonding) said top wafer surface to said first surface of said handle wafer such that said first and second component chips are arranged within said through-wafer cavity. It is to be noted that steps 62, 64, 66 are not necessarily implemented in the order described above.

At step 68, filling (by electroforming or metal deposition) at least a portion of said through-wafer cavity with a heat conducting attachment material so as to hold the first and second component chips in said through-wafer cavity by direct contact of at least a side surface of said first and second component chips with said heat conducting attachment material and so as to hold said barrier structure between the first and second component chips by direct contact with said heat conducting attachment material;

At step 70, detaching the handle wafer from the first and second component chips top surface and the top wafer surface.

At step 72, at least one of: forming a first conductor between the first integrated circuit contact pad and said first component contact pad; and forming a second conductor between the second integrated circuit contact pad and said second component contact pad.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

It is to be noted that a step of pre-fabricating "thermal isolation" or low-thermal conductivity frames or slits/walls based on module design can be implemented prior to the step of aligning and bonding said frames or slits on the carrier wafer. In an example, a frame is made of glass and to produce a structure such as illustrated in FIG. 4D, one can form a glass frame that is of the order of 700 um wide, 700 um long, and 300 um tall, with a sidewall that is 20 um thick. Such a glass frame is for example manufacturable using laser micromachining. Another way is to reflow glass into high-aspect ratio silicon-etched molds, and then remove the silicon, for example using XeF2 etch. See for example the paper entitled: "Capabilities and Limits to Form High Aspect-Ratio Microstructures by Molding of Borosilicate Glass" by Amid Amnache et al.; Journal of Microelectromechanical Systems (Volume: 28, Issue: 3, June 2019), Page(s): 432-440; Print ISSN: 1057-7157; Electronic ISSN: 1941-0158, hereby incorporated by reference in its entirety.

In order to pick-and-place the frame or wall accurately on the carrier wafer, the frame or wall can be temporarily bonded onto a tape or other holding structure that allows for e.g. vacuum pick, as can be done with small chips. The frame or wall can then be bonded to the carrier wafer in a same way as the chips can be bonded according to this presentation, for example by adhesive bonding the frame or wall, and then electroplating around it.

It is noted that producing a structure such as illustrated in FIG. 4B could for example require a glass "slit" or wall to be of the order of 1000 um long, 300 um tall, and 20 um thick. The inventor has noted that it is possible to make such a slit/wall stand on end when placed on its side on tape.

Finally, it is noted that the process of FIG. 7 does not address fully the case when the frame or slit of FIG. 4 consists of air. Such embodiments can be manufactured the same way as with a glass frame or wall as in FIG. 7, but with additional steps to selectively etch the glass after forming the metal embedding/the electroforming step.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112(f), sixth paragraph, unless the element is expressly recited using the phrase "means for . . . " and no method or process step herein is to be construed under those provisions unless the step, or steps, are expressly recited using the phrase "comprising the step (s) of . . . ."

All elements, parts and steps described herein are preferably included. It is to be understood that any of these elements, parts and steps may be replaced by other elements, parts and steps or deleted altogether as will be obvious to those skilled in the art.

What is claimed is:

1. An electronic assembly, having:
    a carrier wafer with a top wafer surface and a bottom wafer surface;
    an electronic integrated circuit being formed in the carrier wafer and comprising first and second integrated circuit contact pads on at least one of the top wafer surface and the bottom wafer surface; said carrier wafer comprising a through-wafer cavity having walls that join said top wafer surface to said bottom wafer surface;
    a first component chip with a first component chip top surface, a first component chip bottom surface and first component chip side surfaces, the first component chip being held in said through-wafer cavity by direct contact of at least a side surface of said first component chip with a heat conducting attachment material that fills at least a portion of said through-wafer cavity; said first component chip comprising at least one first component contact pad on at least one of said first component chip top surface and said first component chip bottom surface;
    a second component chip with a second component chip top surface, a second component chip bottom surface and second component chip side surfaces, the second component chip being held in said through-wafer cavity by direct contact of at least a side surface of said second component chip with said heat conducting attachment material; said second component chip comprising at least one second component contact pad on at least one of said second component chip top surface and said second component chip bottom surface;
    wherein a barrier having a heat conductivity lower than a heat conductivity of said carrier wafer is held by said heat conducting attachment material in said through-wafer cavity between said first and said second component chips;
    and having at least one of:
    a first conductor connecting said first integrated circuit contact pad and said first component contact pad; and
    a second conductor connecting said second integrated circuit contact pad and said second component contact pad;
    wherein said heat conducting attachment material is a metal.

2. The assembly of claim 1, wherein, the first and second component chips have first and second heights and the barrier has a barrier height at least as large as the smallest of the first and second heights.

3. The assembly of claim 1, wherein, the through-wafer cavity has a cavity height and the barrier height is equal to the cavity height.

4. The assembly of claim 1, wherein the first and second component chips have each a side closest to the barrier that have first and second lengths, and wherein the barrier has a barrier length at least as large as the smallest of said first and second lengths.

5. The assembly of claim 1, wherein, the through-wafer cavity has a cavity length and the barrier length is equal to the cavity length.

6. The assembly of claim 1, wherein the barrier comprises two walls arranged each parallel to a different side surface of one of the first and second component chips.

7. The assembly of claim 1, wherein the barrier surrounds one of the first and second component chips.

8. The assembly of claim 1, wherein the barrier material comprises one of air, ceramic and glass.

9. The assembly of claim 1, wherein the barrier has a thickness equal to one fifth or more of a distance between the first and second component chips.

10. The assembly of claim 1, wherein the heat conducting attachment material holds the first and second component chips such that the first and second component chips top surfaces are flush with the top wafer surface.

11. The assembly of claim 1, wherein a metal layer covers at least a portion of the bottom wafer surface as well as the heat conducting attachment material in the through-wafer cavity.

12. The assembly of claim 1, wherein the walls of the through-wafer cavity are covered with a dielectric layer.

13. The assembly of claim 1, wherein the heat-conducting attachment material contacts more than half of each first and second component chips side surfaces.

14. The assembly of claim 1, wherein the carrier wafer and at least the first or second component chips are made of different materials.

15. The assembly of claim 1, wherein at least one of the first and second component chips is an integrated circuit chip comprising one or more transistors.

16. The assembly of claim 1, wherein the carrier wafer and at least one of the first and second component chips have a different height.

17. A method of manufacturing an electronic assembly, the method comprising:
    providing a first component chip having a first component chip top surface, a first component chip bottom surface and first component chip side surfaces; said first component chip comprising at least one first component contact pad on said first component chip top surface;
    providing a second component chip having a second component chip top surface, a second component chip bottom surface and second component chip side surfaces; said second component chip comprising at least one second component contact pad on said second component chip top surface;
    providing a handle wafer having a first surface, and attaching said first and second component chips top surfaces to said first surface of said handle wafer;
    providing a carrier wafer having a top wafer surface and a bottom wafer surface; forming in the carrier wafer an electronic integrated circuit having first and second integrated circuit contact pads on the top wafer surface; forming in the carrier wafer a through-wafer cavity having walls that join said top wafer surface to said bottom wafer surface;
    attaching said top wafer surface to said first surface of said handle wafer such that said first and second component chips are arranged within said through-wafer cavity;
    positioning a barrier structure having a heat conductivity lower than a heat conductivity of said carrier wafer in said through-wafer cavity between the first and second component chips;
    filling at least a portion of said through-wafer cavity with a heat conducting attachment material so as to hold the first and second component chips in said through-wafer cavity by direct contact of at least a side surface of said first and second component chips with said heat conducting attachment material and so as to hold said barrier structure between the first and second component chips by direct contact with said heat conducting attachment material;

detaching the handle wafer from the first and second component chips top surface and the top wafer surface; and at least one of:

forming a first conductor between the first integrated circuit contact pad and said first component contact pad; and forming a second conductor between the second integrated circuit contact pad and said second component contact pad;

wherein said heat conducting attachment material is a metal.

18. The method of claim 17, wherein said positioning a barrier structure having a heat conductivity lower than a heat conductivity of said carrier wafer in said through-wafer cavity between the first and second component chips comprises attaching the barrier structure to said first surface of said handle wafer and/or to at least a wall of said through-wafer cavity.

19. The method of claim 17, wherein said filling at least a portion of said through-wafer cavity with said metal comprises depositing said metal by electroplating.

20. The method of claim 17, wherein the barrier structure comprises two walls arranged each parallel to a different side surface of one of the first and second component chips.

21. The method of claim 17, wherein the barrier structure is arranged parallel to at least two side surfaces of one of the first and second component chips.

22. The method of claim 17, wherein the barrier structure surrounds one of the first and second component chips.

23. The method of claim 17, wherein said positioning a barrier structure between the first and second component chips comprises positioning a sacrificial structure between the first and second component chips which can be removed, after said filling at least a portion of said through-wafer cavity with an attachment material, to provide a barrier structure made out of air.

* * * * *